United States Patent
Liu et al.

(10) Patent No.: US 7,566,641 B2
(45) Date of Patent: Jul. 28, 2009

(54) LOW ETCH PIT DENSITY (EPD) SEMI-INSULATING GAAS WAFERS

(75) Inventors: Weiguo Liu, San Leandro, CA (US); Morris S. Young, Fremont, CA (US); M. Hani Badawi, Santa Clara, CA (US)

(73) Assignee: AXT, Inc., Fremont, CA (US)

( * ) Notice: Subject to any disclaimer, the term of this patent is extended or adjusted under 35 U.S.C. 154(b) by 133 days.

(21) Appl. No.: 11/801,712

(22) Filed: May 9, 2007

(65) Prior Publication Data
US 2008/0280427 A1    Nov. 13, 2008

(51) Int. Cl.
*H01L 21/00* (2006.01)
(52) U.S. Cl. .......................... 438/478; 117/81
(58) Field of Classification Search ............... 438/478; 117/81–83
See application file for complete search history.

(56) References Cited

U.S. PATENT DOCUMENTS

| 4,999,082 | A | 3/1991 | Kremer et al. |
| 5,137,847 | A | 8/1992 | Shimakura et al. |
| 5,584,929 | A | 12/1996 | Kawase |
| 6,896,729 | B2 | 5/2005 | Liu et al. |
| 2002/0175337 | A1 | 11/2002 | Chen et al. |
| 2003/0172870 | A1 | 9/2003 | Liu et al. |
| 2006/0183329 | A1 | 8/2006 | Leung et al. |
| 2006/0260536 | A1* | 11/2006 | Wachi et al. ............... 117/13 |
| 2006/0272572 | A1 | 12/2006 | Uematsu et al. |

FOREIGN PATENT DOCUMENTS

EP        0 803 593 B1    4/1997

* cited by examiner

*Primary Examiner*—Savitri Mulpuri
(74) *Attorney, Agent, or Firm*—DLA Piper LLP (US)

(57) ABSTRACT

A method for manufacturing wafers using a low EPD crystal growth process and a wafer annealing process is provided that results in GaAs/InGaP wafers that provide higher device yields from the wafer.

11 Claims, 2 Drawing Sheets

LOW ETCH PIT DENSITY (EPD) SEMI-INSULATING GAAS WAFERS

FIELD

A method for manufacturing low etch pit density (EPD) GaAs wafers that can be used to manufacture Heterostructure Bipolar Transistors (HBT) and pseudo-morphic High Electron Mobility (pHEMT) devices is provided.

BACKGROUND

It is well known in the Gallium Arsenide (GaAs) industry that a etch pit density (EPD) level of a substrate is very important in minority carrier device reliability and in the yield of devices from the substrate. However, in GaAs electronic devices, such as hetero-structure bipolar transistors (HBTs) and pseudomorphic high electron mobility transistors (pHEMTs), substrate EPD is not known to be a determining factor in device yield.

Wafer annealing is well known. In addition, ingot annealing is known as described in "Improved Uniformity of LEC Undoped Gallium Arsenide Produced by High Temperature Annealing" by Rumsby et al., GaAs IC Symposium, pp. 34-37 (1983).

Techniques for growing semiconductor crystals using a vertical gradient freeze (VGF) and carbon doping are known, such as those disclosed in U.S. Pat. No. 6,896,729 to Liu et al VGF fabrication consistent with the innovations here encompass crystal growth technology, apparatus, and processes whereby large single crystal ingots are grown with a very high level of structural uniformity and low defect density. According to one exemplary implementation, controlled growth of GaAs is achieved by placing a dopant material in an ampoule outside a growth crucible, not in contact with the molten charge. Since the dopant materials are separated from the melt or the internal wall of the crucible, the process is favorable for achieving a high single crystal growth yield. An exemplary VGF process for achieving controlled incorporation of carbon in the growth of semi-insulating GaAs material, is as follows: (1) loading charges of GaAs raw materials into the crucible, (2) placing carbon doping sources within, generally at a low end of, the ampoule, (3) loading the crucible with the GaAs charges into the ampoule, (4) evacuating/sealing under vacuum the ampoule containing the dopant, the crucible, the GaAs charges, and $B_2O_3$ material, and (5) heating/melting the charge and then controlling the liquid-solid interface, wherein control of the amount of the dopant and/or the temperature are used to grow semi-insulating GaAs ingots with high uniformity and low defects. It is desirable to provide a method for manufacturing low etch pit density (EPD) InGaP and GaAs wafers using annealing and VGF and it is to this end that the present invention is directed.

DETAILED DESCRIPTION OF AN EMBODIMENT

The method is particularly applicable to manufacturing a GaAs substrate and it is in this context that the method will be described. It will be appreciated, however, that the method has greater utility since it can be used, for example, to manufacture other types of substrates, such as indium phosphide (InP), gallium phosphide (GaP) and other related III-V compound semiconductors.

Figure 1:
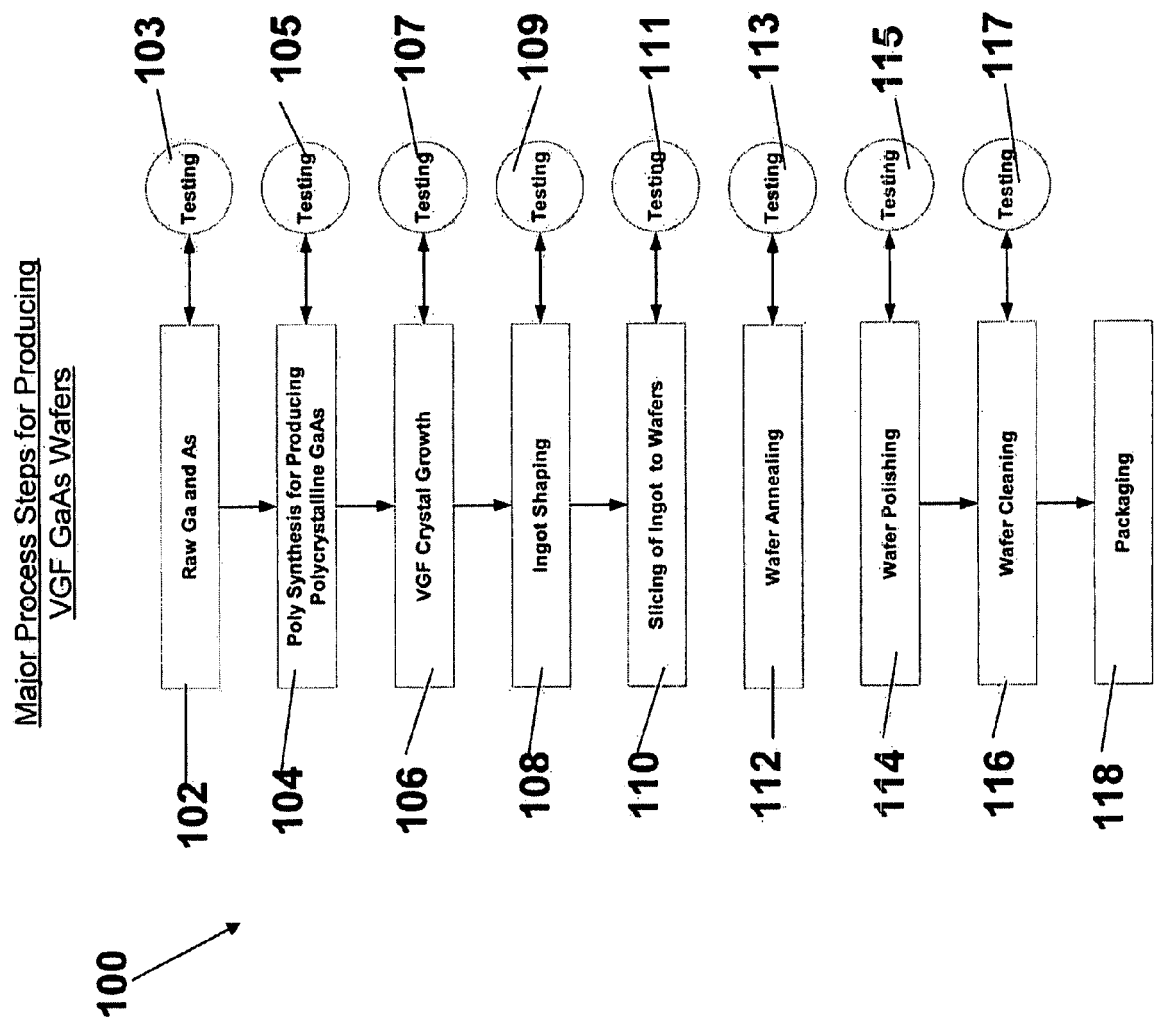
FIG. 1 illustrates a method for fabricating GaAs wafers using a vertical growth furnace process.

FIG. 1 illustrates a method for fabricating GaAs wafers using a vertical growth furnace process 100. The process results in low light point defect, low etch pit density GaAs substrates. This process may also be used to fabricate indium phosphide (InP), gallium phosphide (GaP) or other related III-V compound semiconductors. The fabrication method is a combination of a very low EPD crystal growth process (described below in more detail) and a wafer annealing process (described in more detail below) to achieve the very low EPD and very low light point defects (LPD) wafers. The growth of very low EPD, semi-insulating GaAs wafers by the VGF process results in high device yield in highly integrated GaAs circuits. The wafer annealing process yields very low LPD and a controlled level of Oxygen in the wafers. The low LPD wafers are desired by all semiconductor epitaxial growers since higher LPDs result in lower device yields from the substrates with the higher LPDs due to failure of devices made with the higher LPD substrate.

Returning to FIG. 1, raw Arsenide (As) and Gallium (Ga) are obtained (102) and testing may be performed on the raw materials (103). Once the raw materials are tested, a poly synthesis process (104) is used to produce polycrystalline GaAs which may then be tested (105). Once the polycrystalline GaAs is generated, vertical gradient freeze (VGF) crystal growth occurs (106) as described in more detail in U.S. Pat. No. 6,896,729 to Liu et al. which is incorporated herein by reference. The VGF grown crystals may be tested (107). During the VGF crystal growth, an etch pin density of less than $900/cm^2$. In testing, the process has achieved an EPD as low as $600/cm^2$ for 3" diameter GaAs wafers. There are conventional processes that can produce low EPD GaAs substrates as low as $900/cm^2$, however none of the conventional processes can produce GaAs or other similar wafers at less than $900/cm^2$. Thus, typical processes may achieve an EPD of $900/cm^2$, but cannot achieve the lower EPD levels provided by the VGF process.

To achieve the low EPD, several VGF parameters are carefully controlled. The parameters may include the shape of the melt/crystal interface which is controlled to be concave or convex to the melt front at ±2 mm, crystallization velocity from 2-16 mm/hour, the temperature gradient at the melt/crystal interface between 0.1 to 2 degrees C. and/or a total temperature gradient of between 1 to 4 degrees C.

Once the VGF crystals are grown (and optionally tested), a well known ingot shaping process (108) is conducted and the shaped ingot may also be tested (109). Once the ingot is shaped, the ingot is sliced into wafers (110) and the wafers may be optionally tested (111). The above processes may also be used to product InGaP wafers. As a result of this process, low EPD GaAs/InGaP wafers are produced.

Once the low EPD wafers have been sliced from the ingot, a wafer annealing process (112) is performed wherein the annealed wafers may be tested (113). Instead of the typical three-stage annealing process, a one-stage annealing process is used. During that process the wafers are loaded vertically into a horizontal quartz boat and inserted in a horizontal quartz ampoule along with the required Arsenic lumps. These Arsenic lumps are carefully weighed to provide the needed vapor pressure at the annealing temperature to avoid any Arsenic dissociation from the substrates. The ampoule is then pumped down to a high vacuum level (<5E-3 Torr) and sealed. The ampoule and its contents are then inserted into a horizontal 3-zone furnace and the heating of the ampoule and its contents to the desired set (platform) temperature is initiated.

When the platform temperature (900 C to 1050 C) is reached it is held constant for several hours (10 to 48 hours). Subsequently, the heating is decreased and the ampoule is allowed to cool down to room temperature within a set time (6 to 24 hrs). During the one-stage annealing process, the oxygen level in the GaAs wafers is controlled by adjusting the vacuum level in the ampoule The annealing process conditions were optimized for heating rate, platform temperature and cooling rate to achieve very low LPD levels (<1/cm2). As a result of the annealing process, the wafer has light point defects as low as <<1/cm2 with particle size >0.3 μm. In addition, the wafer may have as low as <120 particles/wafer, particle size >0.3 μm for 6" wafers.

Once the low EPD wafers are annealed and optionally tested, a known wafer polishing process (114) is performed that polishes the low EPD wafers and the polished wafers may be optionally tested (115). Once the wafers are polished, the wafers are cleaned (116) and optionally tested (117) and then packaged for shipping to customers (118).

Figure 2:
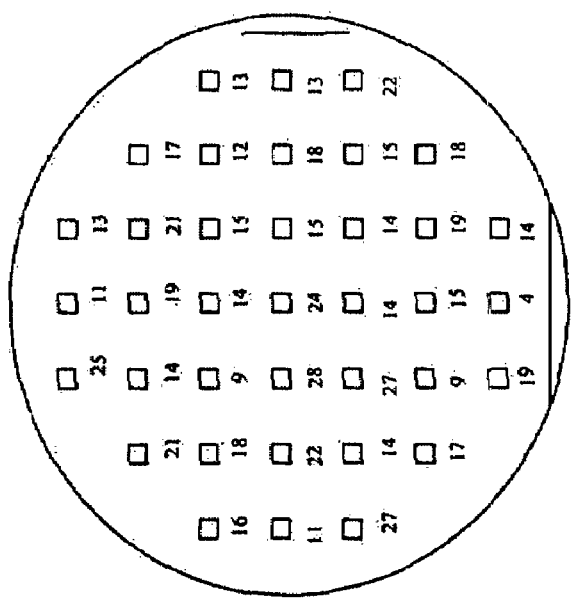
FIG. 2 illustrates an EPD map for an exemplary wafer.

The EPD measurements are performed in accordance with SEMI M36-0699 and ASTM Test Method F1404-92. An example of the EPD level as measured at 37 points (each point having an area of 0.024 cm2) is shown in FIG. 2. This example shows an average EPD of 695/cm2. Note that the EPD is not evenly distributed across the wafer and for this sample, the maximum EPD is 1167/cm2. All the numbers shown in FIG. 2 are actual counts of the number of EPDs—to obtain the EPD value, these numbers should be divided by the unit area (namely, 0.024 cm$^2$) to obtain the number per cm$^2$.

While the foregoing has been with reference to a particular embodiment of the invention, it will be appreciated by those skilled in the art that changes in this embodiment may be made without departing from the principles and spirit of the invention, the scope of which is defined by the appended claims.

The invention claimed is:

1. A method for manufacture a gallium based material with a low etch pit density (EPD), the method comprising:
    performing vertical gradient freeze crystal growth using the polycrystalline gallium based compounds, including:
        providing a crucible containing a seed crystal, GaAs raw material, and $B_2O_3$ material, in an ampoule;
        providing a solid carbon substance in a lower region of the ampoule outside the crucible;
        sealing under vacuum the ampoule containing the solid carbon substance and the crucible;
        heating the sealed ampoule in a controlled manner causing the GaAs raw material to melt, the heat interacting with the solid carbon substance to produce a carbon gas which interacts with the GaAs melt through the $B_2O_3$ material; and
        controlling a temperature gradient at a melt/crystal interface during the vertical gradient freeze crystal growth wherein the temperature gradient at the melt/crystal interface is between 0.1 to 2 degrees Celsius;
    controlling a crystallization velocity during the vertical gradient freeze crystal growth wherein the crystallization velocity is between 2 and 16 mm/hour;
    annealing the gallium arsenide based substrate using a single step annealing, wherein annealing the gallium arsenide based substrate further comprises controlling a heating rate during the annealing wherein the heating rate is 900 to 1050 degrees Celsius over 10 to 48 hours, as well as controlling a cooling rate during the annealing wherein the cooling rate is to room temperature in 6 to 24 hours;
    wherein, as a result of a combination of the vertical gradient steps, the crystallization control steps and the annealing steps, gallium based crystals are reproducibly provided having an etch pit density that is achieved without use of contact or external gas source supplied doping techniques and is less than 600 per square centimeter.

2. The method of claim 1 further comprising forming a gallium arsenide substrate from the gallium based crystal.

3. The method of claim 1 further comprising forming a indium phosphide, gallium phosphide or other III-V substrates from the gallium based crystal.

4. The method of claim 1, wherein performing vertical gradient freeze crystal growth further comprises controlling a shape of the melt/crystal interface during the vertical gradient freeze crystal growth wherein the shape is concave or convex to a melt front.

5. The method of claim 1, wherein performing vertical gradient freeze crystal growth further comprises controlling a total temperature gradient during the vertical gradient freeze crystal growth wherein the total temperature gradient is between 1 and 4 degrees Celsius.

6. The method of claim 2, wherein performing vertical gradient freeze crystal growth further comprises controlling a shape of the melt/crystal interface during the vertical gradient freeze crystal growth wherein the shape is concave or convex to a melt front.

7. The method of claim 2, wherein performing vertical gradient freeze crystal growth further comprises controlling a total temperature gradient during the vertical gradient freeze crystal growth wherein the total temperature gradient is between 1 and 4 degrees Celsius.

8. The method of claim 3, wherein performing vertical gradient freeze crystal growth further comprises controlling a shape of the melt/crystal interface during the vertical gradient freeze crystal growth wherein the shape is concave or convex to a melt front.

9. The method of claim 3, wherein performing vertical gradient freeze crystal growth further comprises controlling a total temperature gradient during the vertical gradient freeze crystal growth wherein the total temperature gradient is between 1 and 5 degrees Celsius.

10. The method of claim 4, wherein performing vertical gradient freeze crystal growth further comprises controlling a total temperature gradient during the vertical gradient freeze crystal growth wherein the total temperature gradient is between 1 and 5 degrees Celsius.

11. The method of claim 6, wherein performing vertical gradient freeze crystal growth further comprises controlling a total temperature gradient during the vertical gradient freeze crystal growth wherein the total temperature gradient is between 1 and 5 degrees Celsius.

* * * * *